US009065482B1

(12) United States Patent
Johnston et al.

(10) Patent No.: US 9,065,482 B1
(45) Date of Patent: Jun. 23, 2015

(54) CIRCUIT FOR FORWARD ERROR CORRECTION ENCODING OF DATA BLOCKS

(71) Applicant: Xilinx, Inc., San Jose, CA (US)

(72) Inventors: Graham Johnston, Edinburgh (GB); David I. Lawrie, Lauder (GB)

(73) Assignee: XILINX, INC., San Jose, CA (US)

( * ) Notice: Subject to any disclaimer, the term of this patent is extended or adjusted under 35 U.S.C. 154(b) by 183 days.

(21) Appl. No.: 13/799,455

(22) Filed: Mar. 13, 2013

(51) Int. Cl.
*H03M 13/00* (2006.01)
*H03M 13/05* (2006.01)

(52) U.S. Cl.
CPC ................................ *H03M 13/05* (2013.01)

(58) Field of Classification Search
CPC ..... H03M 13/00; H03M 13/05; H03M 13/11; H03M 13/23; H03M 13/29; H03M 13/6516; H03M 13/33; H03M 13/3723; H03M 13/6508; H03M 13/6513; H03M 13/2957
USPC .......................................................... 714/781
See application file for complete search history.

(56) References Cited

U.S. PATENT DOCUMENTS

| | | | |
|---|---|---|---|
| 5,140,596 A * | 8/1992 | Weldon, Jr. | .................... 714/762 |
| 5,754,563 A | 5/1998 | White | |
| 5,875,200 A | 2/1999 | Glover et al. | |
| 6,836,869 B1 | 12/2004 | Wyland | |
| 7,124,064 B1 | 10/2006 | Thurston | |
| 7,243,292 B1 | 7/2007 | Naslund et al. | |
| 7,509,564 B2 | 3/2009 | Dohmen et al. | |
| 8,862,968 B1 | 10/2014 | Johnston | |
| 2007/0266291 A1 | 11/2007 | Toda et al. | |
| 2008/0140740 A1 | 6/2008 | Williamson et al. | |
| 2009/0150754 A1 | 6/2009 | Dohmen et al. | |

OTHER PUBLICATIONS

BBC, Research & Development White Paper, WHP 031, Reed-Solomon error correction, C.K.P. Clarke, British Broadcasting Corporation, Jul. 2002, 48 pages.
Paar, Christof, "Optimized Arithmetic for Reed-Solomon Encoders", ECE Department, 1997 IEEE International Symposium on Information Theory, Jun. 29-Jul. 4, 1997, pp. 1-7, Ulm, Germany.
Xilinx, Inc., LogiCORE IP, Reed-Solomon Encoder v7.1, Datasheet DS251, Product Specification, Mar. 1, 2011, pp. 1-16, Xilinx, Inc., 2100 Logic Drive, San Jose, CA USA.

* cited by examiner

*Primary Examiner* — Guy Lamarre
(74) *Attorney, Agent, or Firm* — LeRoy D. Maunu

(57) ABSTRACT

Approaches are disclosed for encoding N symbols of a sequence in parallel using an R parity symbol encoding algorithm. A first symbol matrix is added to a first parity matrix over a finite field to produce a first intermediate matrix. The first intermediate matrix is multiplied by at least a first coefficient matrix and a second coefficient matrix over the finite field to produce a second intermediate matrix. A second symbol matrix is multiplied by at least the second coefficient matrix to produce a third intermediate matrix. The second and third intermediate matrices are added to produce a revised parity matrix.

20 Claims, 9 Drawing Sheets

US 9,065,482 B1

CIRCUIT FOR FORWARD ERROR CORRECTION ENCODING OF DATA BLOCKS

FIELD OF THE INVENTION

The disclosure generally relates to encoding data blocks.

BACKGROUND

In the design of communications systems, there is generally a compromise between bit error rate (BER) and transmission bit rate. Higher bit rates tend to have higher BERs. A well-known limit on capacity of a communications channel is the Shannon Limit. In practice, where forward error correction (FEC) is used, the Shannon Limit is a theoretical boundary on channel capacity for a given modulation and code rate, where the code rate is the ratio of data bits to total bits transmitted per unit time. FEC coding adds redundancy to a message by encoding such a message prior to transmission. Some example error correction codes include Hamming, Bose-Chaudhuri-Hochquenghem (BCH), Reed-Solomon (RS), Viterbi, trellis, etc.

For high-speed communication applications, parallel processing may be needed to meet throughput requirements. One approach to parallelize Reed-Solomon encoding implements multiple instances of the standard encoder, and each instance decodes a separate data block or data channel. Another approach modifies the standard Reed-Solomon encoder to process multiple data blocks of multiple data channels in a time-division-multiplexed (TDM) fashion. Neither of these approaches is desirable because the former solution increases hardware requirements linearly as the number of channels increases, and the latter solution increases latency of the encoding.

One or more embodiments may address one or more of the above issues.

SUMMARY

A method is provided for encoding N symbols of a sequence in parallel using an R parity symbol encoding algorithm. Using one or more circuits, a first symbol matrix is added over a finite field to produce a first intermediate matrix. The first symbol matrix includes symbols 1 through L of the N symbols to a first parity matrix over a finite field to produce a first intermediate matrix. The first parity matrix includes parity symbols calculated from a set of symbols of the sequence that precedes the N symbols in the sequence, where N=L+M. The first intermediate matrix is multiplied by at least a first coefficient matrix and a second coefficient matrix over the finite field to produce a second intermediate matrix. The first coefficient matrix includes a first respective set of constants for each one of L coefficients of an R-coefficient code generation polynomial. The second coefficient matrix includes a respective set of constants for each one of M coefficients of the R-coefficient code generation polynomial. A second symbol matrix is multiplied by at least the second coefficient matrix to produce a third intermediate matrix. The second symbol matrix includes M symbols that immediately follow the L symbols in the N-symbol sequence. At least the second and third intermediate matrices are added to produce a second parity matrix.

A system is provided for encoding N symbols of a sequence in parallel using an R parity symbol encoding algorithm. A first circuit is configured to multiply a first parity matrix by at least a first coefficient matrix and a second coefficient matrix over a finite field to produce a first intermediate matrix. The first parity matrix includes parity symbols calculated from a set of symbols of the sequence that precede the N symbols in the sequence. The first coefficient matrix includes a first respective set of constants for each one of L coefficients of an R-coefficient code generation polynomial. The second coefficient matrix includes a respective set of constants for each one of M coefficients of the R-coefficient code generation polynomial. A second circuit is configured to multiply a first symbol matrix by at least the first and second coefficient matrices over the finite field to produce a second intermediate matrix. The first symbol matrix includes symbols 1 through L of the N symbols. A third circuit is configured to multiply a second symbol matrix by at least the second coefficient matrix over the finite field to produce a third intermediate matrix. The second symbol matrix includes M symbols that immediately follow the L symbols in the N-symbol sequence. A fourth circuit is configured to add at least the first, second, and third intermediate matrices over the finite field to produce a revised parity matrix.

In another method, N symbols of a sequence are encoded in parallel using an R parity symbol encoding algorithm. Using a first pipeline stage, a first symbol matrix is multiplied by a first coefficient matrix over a finite field to produce a first intermediate matrix. The first symbol matrix includes symbols 1 through L of the N symbols, and the first coefficient matrix includes a first respective set of constants for each one of L coefficients of an R-coefficient code generation polynomial. Using a second pipeline stage, a sum of the first intermediate matrix and a second symbol matrix is multiplied by a second coefficient matrix over the finite field to produce a second intermediate matrix. The second intermediate matrix is added to a first parity matrix over the finite field to produce a third intermediate matrix. The first parity matrix includes parity symbols calculated from a set of symbols of the sequence that precede the N symbols in the sequence, wherein N=L+M. The third intermediate matrix is multiplied by at least the first and second coefficient matrices over the finite field to produce a second parity matrix.

Other features and aspects will be recognized from consideration of the Detailed Description and Claims, which follow.

BRIEF DESCRIPTION OF THE DRAWINGS

Various aspects of the disclosed methods and systems will become apparent upon review of the following detailed description and upon reference to the drawings in which.

DETAILED DESCRIPTION OF THE DRAWINGS

Figure 1:
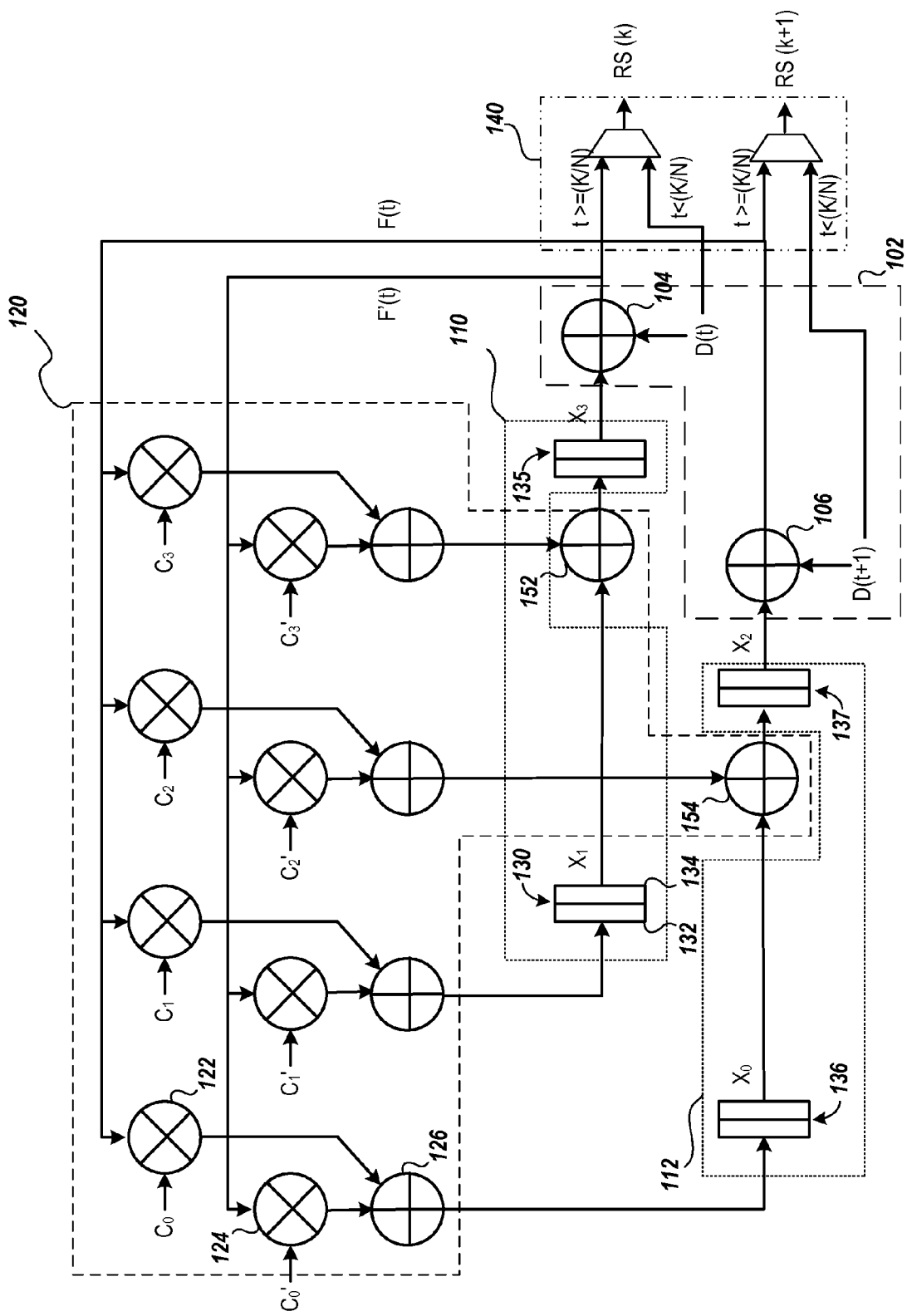
FIG. 1 shows a partially parallel encoder.

Many codes have been standardized in the International Telecommunication Union Telecommunication Standardization Sector (ITU-T) G.975 and G.709. For example, the standardized Reed-Solomon (255, 239) code has a net coding gain (NCG) of 6.2 dB at a $10^{-15}$ decoder output bit error rate (BER) with a 6.69% redundancy ratio. However, for high-speed (10 Gb/s and beyond) communication systems, more powerful forward error correction (FEC) codes have become necessary in order to achieve greater correction capability to compensate for serious degradation in transmission quality.

More recently, Super-FEC coding schemes have been developed that utilize a combination of two or more encoding schemes to provide greater BER correction capability and increase throughput. Generally, RS encoding is combined with another encoding scheme. For example, ITU-T G.975.1 I.4 specifies a concatenation of RS and BCH encoding schemes. Due to its high performance, RS encoding is expected to remain in widespread use for FEC encoding and a variety of Super-FEC coding schemes.

Reed-Solomon codes are systematic block codes used for error correction. Input data is partitioned into data blocks containing K symbols. Each block of K input symbols is used to generate R check/parity symbols. The combination of K input symbols and R check/parity symbols are concatenated to form an L symbol codeword that may be used to detect and correct corruption of the codeword.

The R check/parity symbols correspond to the remainder polynomial from finite field polynomial division, where the dividend polynomial is given by the block of K input symbols and the divisor polynomial is a code generator polynomial, G(t), given by the particular Reed-Solomon code that is being used. The code generator polynomial of order R, takes the form:

$$G(y)=y^R+C_{R-1}*y^{R-1}+C_2*y^2+C_1*y+C_0, C_r=1.$$

The generator polynomial is an irreducible polynomial having a number of coefficients (R), which is equal to the number of check/parity symbols in each code block.

Evaluating the remainder polynomial from finite field polynomial division is a complex operation requiring significant resources such as circuit area and computation time. In an application that continuously generates Reed-Solomon-encoded data, the evaluation of the remainder polynomial needs to achieve a throughput rate that equals or exceeds the data rate of the vectors of input symbols.

A standard Reed-Solomon encoder evaluates the remainder polynomial in a recursive process requiring K iterations. Each iteration requires multiple, simultaneous, finite field multiplications and additions/subtractions. To calculate the modulus of the division, an incomplete remainder is maintained throughout the calculation. In each iteration t ($0 \leq t \leq K$), the remainder X(t) is calculated by adding a new data symbol, D(t), to the most significant symbol ($X_{R-1}$) of the previously calculated remainder X(t−1), and the result is multiplied by the generator polynomial G(y) and subtracted from X(t−1), as shown in the following equation:

$$X(t)=X(t-1)-G(y)*((X_{R-1}(t-1)+D(t))$$

In the Reed-Solomon encoder, Galois field arithmetic is used. This means that in this equation addition is achieved by bitwise XOR, and is the same operation as subtraction. Multiplication is achieved using a Galois Field multiply operation.

One or more embodiments provide a circuit and method for Reed-Solomon encoding, in which the feedback arithmetic of the recursive finite field division is altered so that multiple input symbols of a code block are processed simultaneously. The resulting design uses less hardware than would be required to implement multiple instances of the standard encoder while achieving the same level of throughput.

The encoding process may be understood with reference to a matrix description of the recursive finite field division. For example, each iteration, t, of the standard Reed-Solomon encoding process discussed above, can be represented as a matrix multiplication:

$$X(t+1) = \begin{bmatrix} C_{R-1} & I & 0 & \cdots & 0 \\ C_{R-2} & 0 & I & \cdots & 0 \\ \vdots & \vdots & \vdots & \ddots & \vdots \\ C_1 & 0 & 0 & \cdots & I \\ C_0 & 0 & 0 & \cdots & 0 \end{bmatrix} * \begin{bmatrix} X_{R-1}(t) + D(t) \\ X_{R-2}(t) \\ \vdots \\ X_1(t) \\ X_0(t) \end{bmatrix}$$

where, X(t+1) is resulting the value of the partial remainder following iteration t. For ease of reference, the partial remainder updated in each iteration may be referred to as an intermediate polynomial and such terms may be used interchangeably herein. The first matrix in the above calculation is an R×R matrix of matrices. Each coefficient $C_N$ in the first matrix represents an R×R matrix of XOR operations in the finite field multiplication, and each matrix I in the first matrix represents an R×R identity matrix of XOR operations. For ease of reference, the first matrix may be referred to as a coefficient matrix. The second matrix is an R×1 matrix of matrices. D(t) is the current R-bit input data symbol, and $X_N(t)$ is the R-bit symbol, which represents one of the R data symbols of the partial remainder X(t) stored in the registers in the feedback loop.

One or more embodiments expand the above matrix calculation to calculate X(t+2) (i.e., the value of the partial remainder after 2 cycles of processing) in a single clock cycle. A detailed treatment of part of this calculation is shown for an arbitrary sized Reed-Solomon code, with output block size L, input block size K and a generator polynomial of order R, (R=L−K). Multiplying the first two rows of the above matrices gives:

$$X_{R-1}(t+1)=C_{R-1}(X_{R-1}(t)+D(t))+X_{R-2}(t)$$

$$X_{R-2}(t+1)=C_{R-2}(X_{R-1}(t)+D(t))+X_{R-3}(t)$$

Advancing by one clock cycle and multiplying gives:

$$X(t+2)=C_{R-1}(X_{R-1}(t+1)+D(t+1))+X_{R-2}(t+1)$$

Substituting X(t+1) gives:

$$X_{R-1}(t+1)=(C_{R-1}^2+C_{R-2})*(X_{R-1}(t)+D(t))+C_{R-1}(X_{R-2}(t)+D(t+1))+X_{R-3}(t)$$

However, in Galois Field arithmetic, $C_{R-1}^2+C_{R-2}$ is an m-bit constant, $C'_{R-1}$. Therefore, $$X_{R-1}(t+2)=C'_{R-1}(X_{R-1}(t)+D(t))+C_{R-1}*(X_{R-2}(t)+D(t+1))+X_{R-3}(t)$$

and the matrix multiplication becomes:

$$X(t+2) = \begin{bmatrix} C'_{R-1} & C_{R-1} & 1 & 0 & \cdots & 0 \\ C'_{R-2} & C_{R-2} & 0 & 1 & \cdots & 0 \\ \vdots & \vdots & \vdots & \vdots & \ddots & \vdots \\ C'_2 & C_2 & 0 & 0 & \cdots & 1 \\ C'_1 & C_1 & 0 & 0 & \cdots & 0 \\ C'_0 & C_0 & 0 & 0 & \cdots & 0 \end{bmatrix} * \begin{bmatrix} X_{R-1}(t) + D(t) \\ X_{R-2}(t) + D(T-1)) \\ \vdots \\ X_2(t) \\ X_1(t) \\ X_0(t) \end{bmatrix}$$

Each of the above X(t+1) and X(t+2) calculations represents a large array of XOR operations performed in each iteration of the encoding process. In the X(t+2) implementation, the XOR operations performed in two iterations of the standard X(t+1) equation can be optimized to perform the calculation using fewer XOR operations. In this manner, hardware resources may be reduced.

FIG. 1 shows a partially parallelized Reed-Solomon encoder. The encoder includes an input circuit 102 configured to receive and process N data symbols of a data block in each iteration. For ease of illustration, the encoder is configured to receive and process two symbols of the data block D(t) and D(t+1) in parallel in each iteration and calculate the partial remainder X(t+2), as discussed above. The iterative process is repeated until all K symbols of the data block have been processed. It is recognized that the encoder may be configured to process various numbers of data symbols (up to R data symbols) in parallel per iteration. Accordingly, the encoder shown in FIG. 1 is described generically using above-mentioned N, R, and K numerical variables to indicate numbers of elements in the circuitry.

The input circuit includes N=2 finite-field addition circuits (104 and 106), each configured to receive a respective one of N input data symbols and add the one received data symbol to a respective symbol (e.g. $X_2$ and $X_3$) of a partial remainder X(t) over a finite field to produce a respective feedback symbol (e.g. F(t) and F'(t)). The partial remainder X(t) is stored using N pipeline buffer circuits 110 and 112.

An XOR logic circuit 120 is configured to multiply the feedback symbols by respective coefficients of code generation polynomial G(y), and add the result to the previous partial remainder X(t) to determine the partial remainder for the next iteration X(t+1). For each coefficient ($C_i$) of a code generation polynomial (G(y)), having R coefficients (0<=i<R), the XOR logic circuit multiplies each of the feedback symbols over the finite field by a respective constant (e.g. $C_0$ and $C'_0$) corresponding to the coefficient $C_i$, using finite field multipliers (e.g. 122 and 124), to produce a first set of intermediate results. The first set of intermediate results are summed over the finite field using a finite field adder (e.g. 126) to produce a second intermediate result. The second intermediate results are added to the buffered previous partial remainder X(t) to determine the partial remainder X(t+1).

The partial remainder is buffered using R shift registers. An example one of the R shift registers is shown as shift register 130. Each shift register includes N individual registers, and each individual register is configured for storage of the bits of a partial remainder. Shift register 130 includes individual registers 132 and 134, for example. The individual registers of a shift register are coupled in a cascade chain such that the output of one individual register is coupled to the input of the next individual register in the chain. For example, the outputs of individual register 132 are coupled to the inputs of individual register 134. Each shift register (e.g., 130) includes a number of individual registers in the chain for buffering N symbol values (i.e., N-deep shift registers) of the partial remainder. In this example, the shift registers 130, 135, 136, and 137 (R=4) are organized into 2 pipelined buffers 110 and 112 (i.e., N=2). When R is evenly divisible by N, as illustrated here, the number of shift registers in each pipelined buffer is equal to R divided by N. However, when R is not evenly divisible by N, the first mod(R,N) pipeline buffers contain a number of shift registers equal to floor(R/N)+1. The remaining pipeline buffers contain a number of shift registers equal to floor(R/N).

Following calculation of the second intermediate results, values are right shifted in each of the pipelined buffers, and the second intermediate results are added to the shifted values, over the finite field, by the logic circuit (using, e.g., 152 and 154). In effect, each pipelined buffer J of the N pipeline buffers receives second intermediate results corresponding to a respective coefficient $C_J$. For example, pipelined buffer 112 (i.e., pipelined buffer J=0), is configured to receive second intermediate results produced by the adder 126 of corresponding coefficient $C_0$ and store the intermediate results in shift register 136.

For every $N^{th}$ coefficient following $C_J$, the logic circuit 120 is configured to add the results corresponding to the coefficient to a symbol of the partial remainder shifted from the previous shift register. For example, for pipelined buffer 112 (i.e., pipelined buffer J=0), the logic circuit 120 includes finite field addition circuit 154 to add the second intermediate results corresponding to coefficient $C_2$ (i.e., $C_{0+2}$) from a symbol output from shift register 136 and input the result to shift register 137. As another example, for pipelined buffer 110 (i.e., pipelined buffer J=1), the logic circuit 120 includes finite field addition circuit 152 to add intermediate results corresponding to coefficient $C_3$ (i.e., $C_{1+2}$) to a symbol output from shift register 130 and input the result to shift register 135.

As described above, a Reed-Solomon encoder generates an output block of size L, which includes the K input data symbols and R (i.e., R=L−K) check/parity symbols. For K/N iterations, an output selection circuit 140 directly outputs the input data symbols. After all K symbols of the data block have been received, the output selection circuit outputs the partial remainders stored in the pipelined buffer circuits 110 and 112.

The encoder circuit shown in FIG. 1 illustrates the finite field addition/subtraction and multiplication operations performed by the logic circuit 120 as being performed by separate circuits. However, because these operations are calculated over a finite field, these circuits may be implemented using XOR logic, which may be reduced or optimized to implement the logic circuit 120 using fewer XOR gates. For example, one or more embodiments optimize the logic circuit to minimize the number of XOR additions that are performed by the logic circuit. Optimization of XOR logic may be performed using any number of known optimization algorithms for XOR logic. This reduction of the XOR logic allows the Reed-Solomon encoder to perform parallel encoding operations with less hardware in comparison to the previous approaches discussed above.

Figure 2:
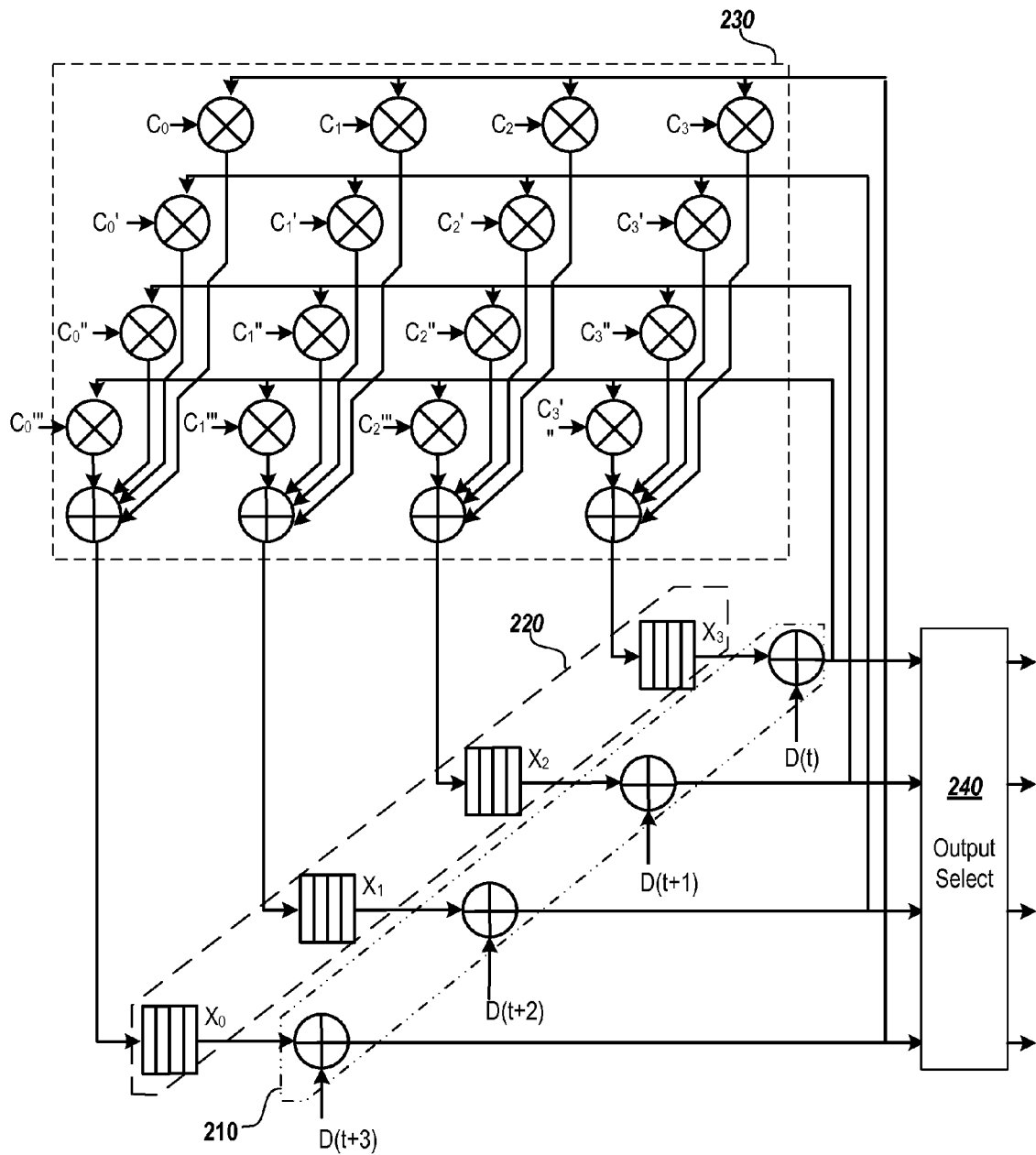
FIG. 2 shows a fully parallel Reed-Solomon encoder.

As described above, the encoder shown in FIG. 1 may be configured to process a desired number of data symbols (up to R data symbols) in parallel per iteration. FIG. 2 shows a fully parallel (i.e., N=R) implementation of the Reed-Solomon encoder shown in FIG. 1. Like FIG. 1, this example implements a code generation polynomial having R=4 coefficients. Similar to FIG. 1, the encoder includes an input circuit 210 configured to receive and process a plurality of data symbols (4 symbols in this example) of a data block per iteration. In this fully parallel implementation, the input circuit includes N=4 finite-field addition circuits, each configured to receive a respective data symbol and add the input data symbol to a partial remainder X(t) to produce a respective feedback symbol. The partial remainder is buffered in a set of R shift registers 220.

As described above, an XOR logic circuit 230 is configured to multiply each of the feedback symbols by a respective set of constants C, C', C'', or C''' corresponding to coefficients of the code generation polynomial G(y). The results of the multiplication operations are summed for each coefficient to produce a symbol of the partial remainder, which is buffered in a respective shift register of buffer circuit 220. In this fully parallel version, hardware of the XOR logic circuit 230 may be implemented to provide an optimal solution in which encoding operations are performed using the amount of XOR resources.

As described with reference to FIG. 1, the fully parallel encoder shown in FIG. 2 includes an output selection circuit 240 that is configured to directly output the input data symbols, for K/N iterations. After K/N iterations, the parity symbols (i.e., the remainder polynomial) stored in the shift registers of buffer circuit 220 are selected as output symbols by output selection circuit 240 as the symbols are output from the shift registers.

Figure 3:
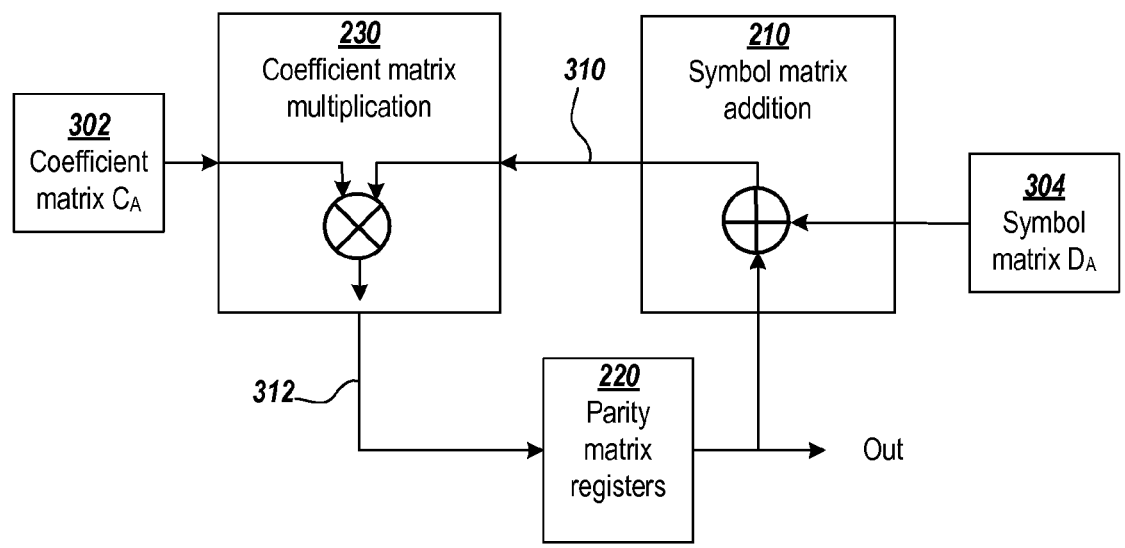
FIG. 3 shows a simplified block diagram of the circuit shown in FIG. 2.

For ease of explanation and reference, FIG. 3 shows a simplified block diagram of the circuit shown in FIG. 2. A first circuit (symbol matrix addition circuit 210) is configured to add a parity matrix (e.g., parity symbols $X_0$, $X_1$, $X_2$, and $X_3$ in registers 220) to a symbol matrix $D_A$ 304 over a finite field to produce a first intermediate matrix 310. In this example, the symbol matrix $D_A$ 304 includes N=4 symbols to be encoded in parallel using an R=4 coefficient code generation polynomial. Referring again to FIG. 2, the symbol matrix $D_A$ 304 is a 1×4 matrix equivalent to input data symbols D(t), D(t+1), D(t+2), and D(t+3) shown in FIG. 2.

A second circuit (coefficient matrix multiplication circuit 230) is configured to multiply the first intermediate matrix by a first coefficient matrix $C_A$ 302 over a finite field to produce a second intermediate matrix 312 that is used as the parity matrix for encoding the next N=4 symbols in the sequence.

As described above, the coefficient matrix includes a first respective set of constants for each one of N coefficients of an R-coefficient code generation polynomial. In the fully-parallel implementation example shown in FIG. 2, N=R and the coefficient matrix $C_A$ 302 is an R×R matrix. For implementations that encode less than R symbols in each iteration (i.e., N<R), the coefficient matrix is formed by concatenating a respective set of constants for each one of N coefficients with an identity matrix. An example concatenation is shown in the above equation described for X(t+2).

In the encoding architecture shown in FIGS. 1-3, the maximum number of symbols of a sequence that can be encoded in parallel (N) is limited to the number of parity symbols R (i.e., coefficients of the code generation polynomial). However, this limitation may be overcome by rearranging the process performed by the encoding architecture shown in FIGS. 1-3.

The operation of the above architecture shown in FIGS. 1-3 can be described as:

$$X^+ = C_N * (X + D_N)$$

where the next set of parity symbols ($X^+$) for the next N symbols ($D_N$) of a data sequence to be encoded is determined by multiplying a coefficient matrix ($C_N$) by the sum of the previous set of parity symbols X and $D_N$. For instance, for RS(255,239) encoding, the encoding of N=16 symbols in parallel using a 16-coefficient code generation polynomial is described as:

$$X^+ = C_{16} * (X + D_{16}).$$

This equation may be extended to facilitate encoding of more than 16 data symbols of a sequence in each encoding iteration. For instance, 20 data symbols may be encoded in parallel by extending the equation to include two decoding iterations. In a first decoding iteration, 16 data symbols are encoded and in a second iteration 4 symbols are encoded. A combination of these two iterations can be described as:

$$X^+ = C_4[\{C_{16}*(X+D_{16})\}+D_4]$$

Here, the term $\{C_{16}*(X+D_{16})\}$ represents the parity symbols after 16 data symbols of the sequence have been encoded using the methodology described above. These parity symbols are added to $D_4$ (the next four symbols) and then the result is multiplied by a respective $C_4$ coefficient matrix extending the calculation for another four symbols. The result of this combined operation encodes 20 symbols of the sequence. As indicated above, all these addition and multiplication operations are performed over a finite field, so each operation can be performed using XOR operations.

The above equation ($X^+$) representing the combination of two encoding iterations can be rearranged into terms that may be calculated in parallel in a single decoding iteration. One arrangement of the terms is given by:

$$X^+ = C_4 C_{16} X + C_4 C_{16} D_{16} + C_4 D_4$$

In this arrangement, the new parity bits X+ are calculated as a function of $C_4$, $C_{16}$, the previous parity bits X, and the data inputs $D_4$ and $D_{16}$. The equation may further be arranged as, $$X^+ = C_4 C_{16}[X+D_{16}] + C_4 D_4$$

Other various arrangements of the equation are also possible.

Figure 4:
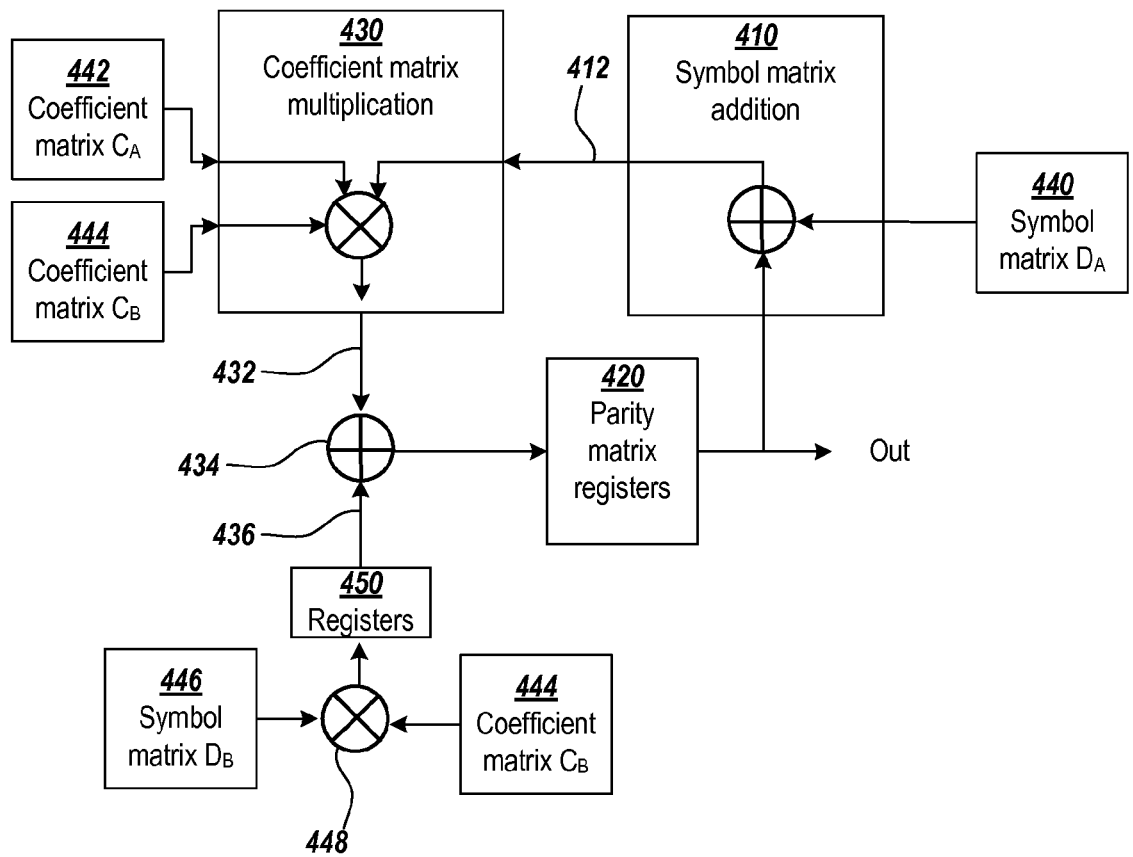
FIG. 4 shows an encoder for encoding two sequential sets of symbols of a sequence in parallel.

FIG. 4 shows an encoder for encoding two sequential sets of symbols of a sequence in parallel. The encoder in this example is configured to encode a first set of symbols ($D_A$) and a second set of symbols ($D_B$) in parallel. The encoding process can be described as:

$$X^+ = C_B C_A[X+D_A] + C_B D_B$$

The term, $C_B C_A [X+D_A]$, is calculated using a first circuit similar to the encoder circuit shown in FIG. 3. A symbol matrix addition circuit 410 is configured to add a parity matrix (e.g., in registers 420) to a symbol matrix $D_A$ 440 over a finite field to produce a first intermediate matrix 412. A coefficient matrix multiplication circuit 430 is configured to multiply the first intermediate matrix 412 by a first coefficient matrix $C_A$ 442 (corresponding to the symbol matrix $D_A$) and by a second coefficient matrix $C_B$ 444 (corresponding to a second symbol matrix $D_B$) over a finite field to produce a second intermediate matrix 432. The first coefficient matrix $C_A$ 442 includes a first respective set of constants for each one of L coefficients of an R-coefficient code generation polynomial, where L is equal to the number of symbols included in the first symbol matrix $D_A$ 440. Similarly, the second coefficient matrix includes a respective set of constants for each one of M coefficients of the R-coefficient code generation polynomial, where M is equal to the number of symbols included in the second symbol matrix $D_B$ 446.

A second circuit 448 multiplies the second symbol matrix $D_B$ 446 by the second coefficient matrix $C_B$ 444 to produce a third intermediate matrix 436. The third intermediate matrix is stored in registers 450. A third circuit 434 is configured to add at the second and third intermediate matrices (432 and 436) to produce a second parity matrix. The second parity matrix is stored in registers 420 and is used as the parity matrix in subsequent encoding iterations.

In some implementations, the encoding process may be extended to encode three or more data symbol matrices in parallel. For example, the process of encoding three sequential sets of data is described by, $$X^+ = C_C C_B C_A[X+D_A] + C_C C_B D_B + C_C D_C.$$

Figure 5:
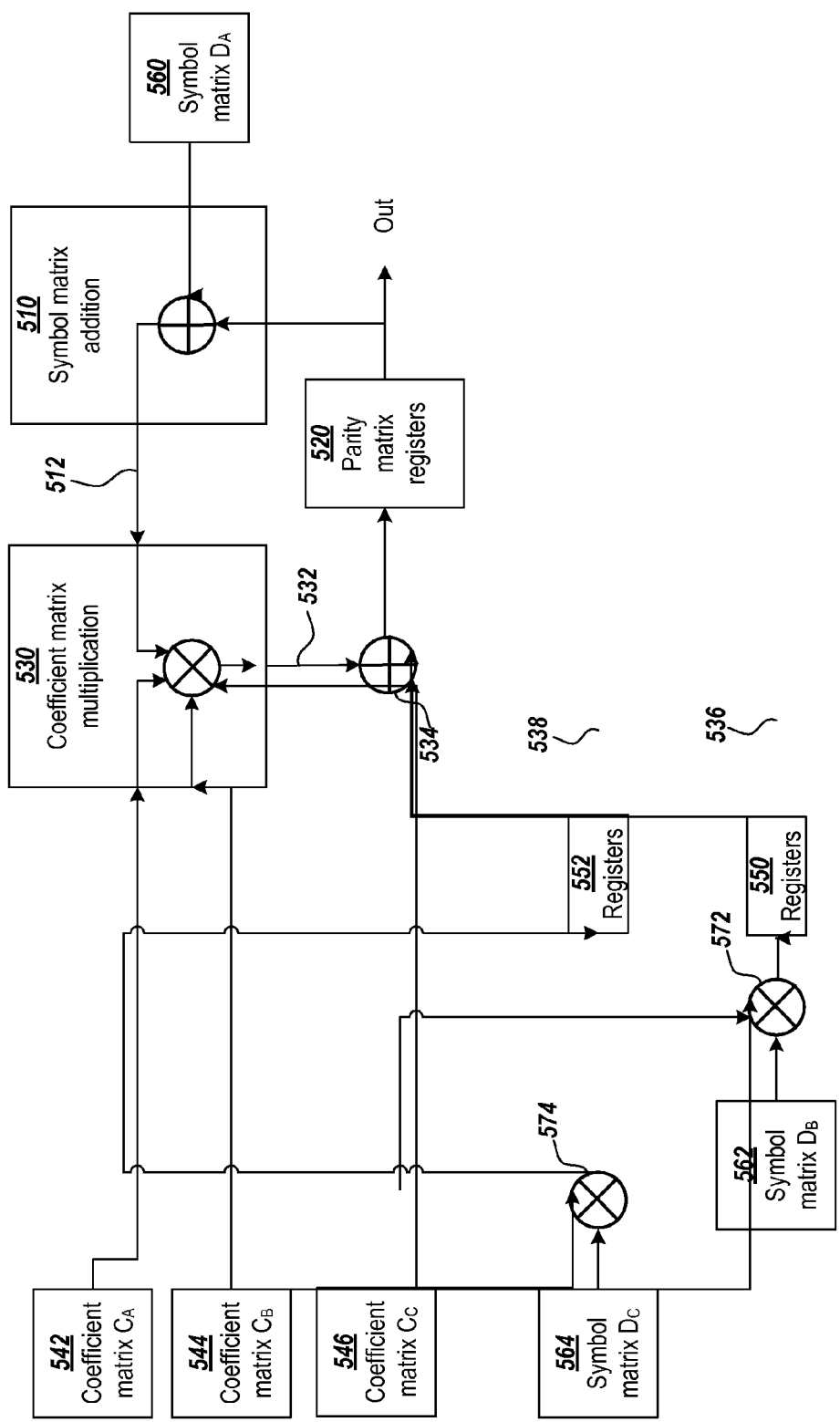
FIG. 5 shows an encoder for encoding three sequential sets of symbols of a sequence in parallel.

FIG. 5 shows an encoder for encoding three sequential sets of symbols of a sequence in parallel. In this example, the encoder shown in FIG. 4 is extended to encode a third set of data symbols. The term, $C_C C_B C_A [X+D_A]$, is calculated in a similar manner to the process performed by the circuit in FIG. 4. In this example, the symbol matrix addition circuit 510 is configured to add a parity matrix (e.g., in registers 520) to a first set of symbols in symbol matrix $D_A$ 560 over a finite field to produce a first intermediate matrix 512. The coefficient matrix multiplication circuit 530 is configured to multiply the first intermediate matrix 512 by first, second, and third coefficient matrices ($C_A$ 542, $C_B$ 544, and $C_C$ 546) over a finite field to produce a second intermediate matrix 532.

In this example, the second circuit 572 is configured to calculate the second term, $C_C C_B D_B$. The second circuit 572 is configured to multiply the second symbol matrix $D_B$ 562 with second and third coefficient matrices, $C_B$ 544 and $C_C$ 546, to produce a third intermediate matrix 536 stored in registers 550. A third circuit 574 is configured to multiply the third symbol matrix $D_C$ 564 with the third coefficient matrix $C_C$ 546 to produce a fourth intermediate matrix 538 stored in registers 552. A fourth circuit 534 is configured to add at the second, third, and fourth intermediate matrices (532, 536, and 538) to produce a second parity matrix.

Figure 6:
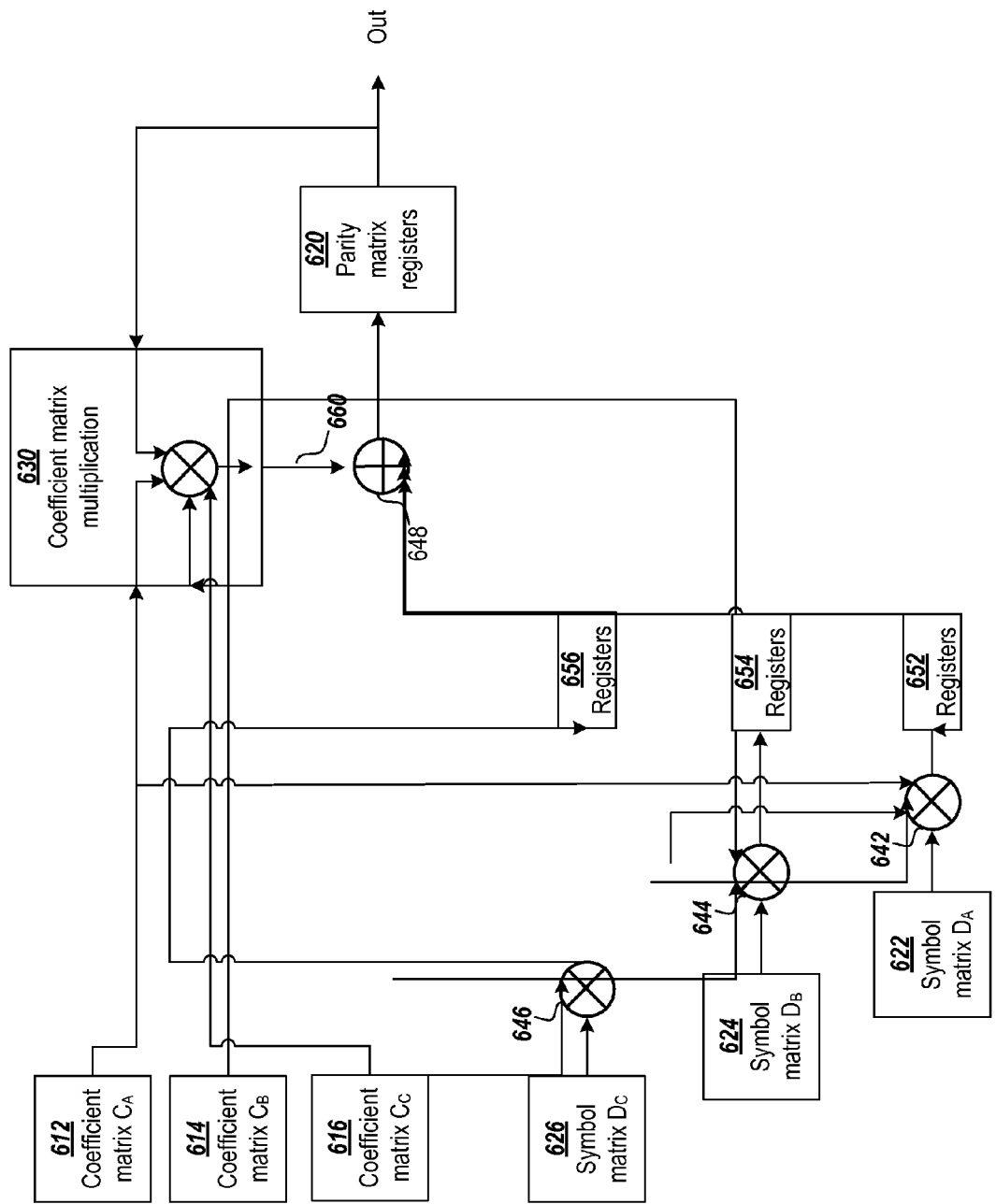
FIG. 6 shows another encoder for encoding three sequential sets of symbols of a sequence in parallel.

FIG. 6 shows another encoder for encoding three sequential sets of symbols of a sequence in parallel. In this example, the encoding process in this example is described by, $$X^+ = C_C C_B C_A X + C_C C_B C_A D_A + C_C C_B D_B + C_C D_C.$$

The first term of the equation is calculated using a first circuit (i.e., coefficient matrix multiplication circuit 630) configured to multiply a parity matrix (e.g., stored in registers 620) by first, second, and third coefficient matrices $C_A$, $C_B$, and $C_C$ (612, 614, and 616) to produce a first intermediate matrix 660.

A second circuit 642 is configured to multiply a first symbol matrix $D_A$ 622 by the first, second, and third coefficient matrices (612, 614, and 616) to produce a second intermediate matrix (e.g., stored in registers 652). A third circuit 644 is configured to multiply a second symbol matrix $D_B$ 624 by the second and third coefficient matrices (614 and 616) to produce a third intermediate matrix (e.g., stored in registers 654). A fourth circuit 646 is configured to multiply a third symbol matrix $D_C$ 626 by the third coefficient matrix (616) to produce a fourth intermediate matrix (e.g., stored in registers 656). A fifth circuit 648 is configured to add at the intermediate matrices to produce a second parity matrix. The second parity matrix is stored in registers 620 and is used as the parity matrix in subsequent encoding iterations.

Figure 7:
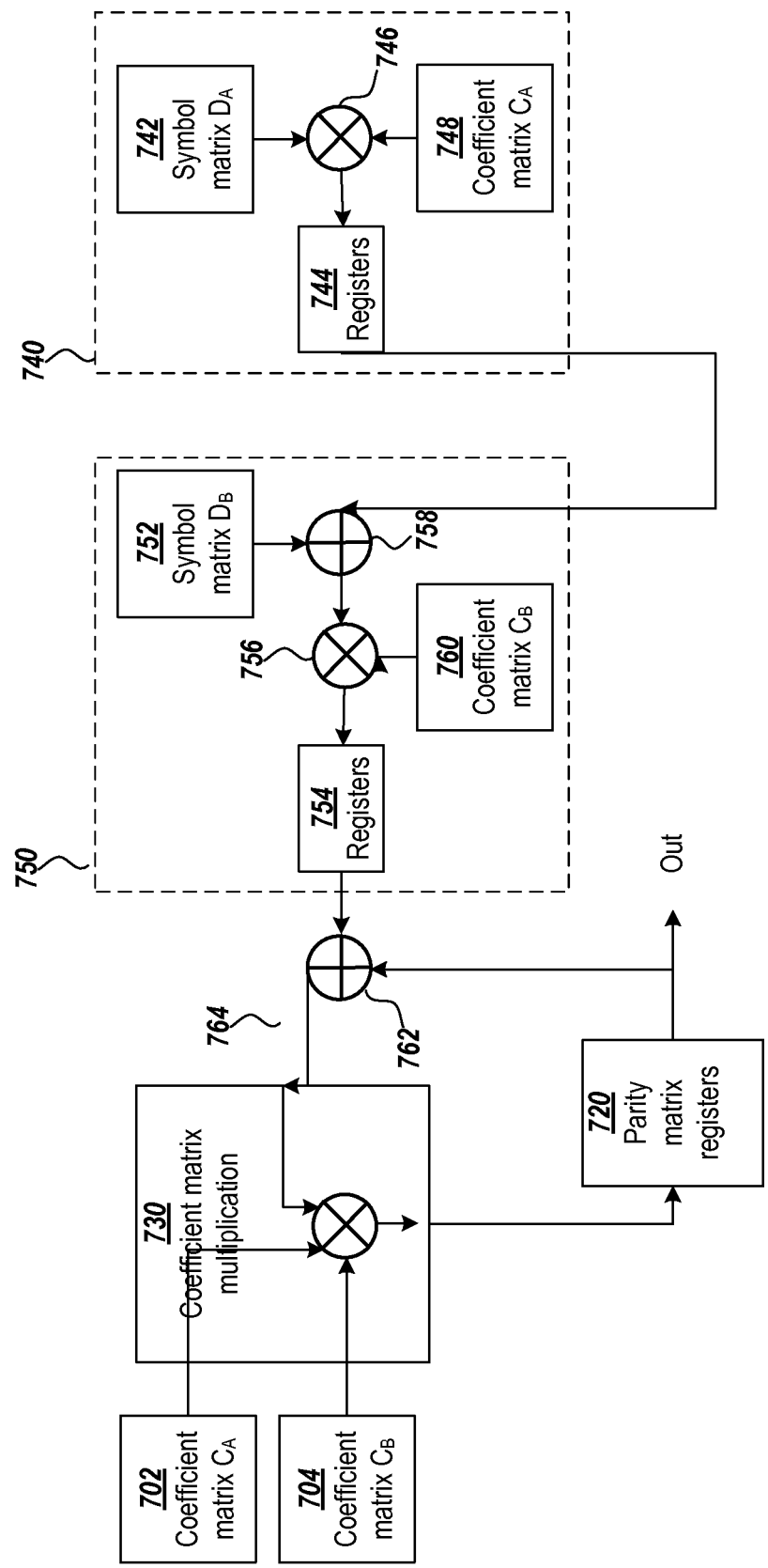
FIG. 7 shows a pipelined encoder for encoding two sequential sets of symbols of a sequence.

In some implementations, the encoding process may be arranged to perform operations in a pipeline. For example, FIG. 7 shows a pipelined encoder for encoding two sequential sets of symbols of a sequence. In a first pipeline stage 740, a first circuit 746 multiplies a first symbol matrix $D_A$ 742 by a first coefficient $C_A$ 748 to produce a first intermediate matrix (e.g., stored in registers 744). In a second pipeline stage 750, circuits 756 and 758 are configured to multiply a second coefficient matrix $C_B$ 760 by the sum of a second symbol matrix $D_B$ 752 and the first intermediate matrix to produce a second intermediate matrix. The second intermediate matrix is stored in registers 754.

Following the pipeline stages, a second circuit 762 is configured to add the second intermediate matrix to a parity matrix (e.g., stored in registers 720) to produce a third intermediate matrix 764. Coefficient matrix multiplication circuit 730 is configured to multiply the third intermediate matrix 764 by first and second coefficient matrices (702 and 704) to produce a second parity matrix, which is stored in registers 720.

The examples in FIGS. 4 through 7 show encoders configured to encode either two or three sequential sets of symbols of a sequence in parallel. However, the encoding processes may be extended to encode any number of sequential sets in parallel. For instance, the process performed by the circuit shown in FIG. 4, (e.g., $X^+ = C_B C_A [X + D_A] + C_B D_B$) is extended to further encode a third set of symbols (e.g., FIG. 5) by adding a third symbol matrix (e.g., $D_C$) as an additional term in the equation and further multiplying each term in the resulting equation by a third coefficient matrix (e.g., $C_C$). As a result, the equation for the process performed in FIG. 5 is produced (e.g., $X^+ = C_C C_B C_A [X + D_A] + C_C C_B D_B + C_C D_C$). This equation may be further modified in a similar manner to produce an equation for encoding four sequential sets of symbols of a sequence in parallel, as given by $$X^+ = C_D C_C C_B C_A [X + D_A] + C_D C_C C_B D_B + C_D C_C D_C + C_D D_D).$$

Similarly the process performed in FIG. 6 (e.g., $X^+ = C_C C_B C_A X + C_C C_B C_A D_A + C_C C_B D_B + C_C D_C$) may be extended to encode additional sets of symbols in parallel. The equation for the process is similarly extended by adding an additional symbol matrix (e.g., $D_D$) as a new term in the equation and multiplying each term in the resulting equation by a corresponding coefficient matrix $C_D$. As a result, the equation becomes, $$X^+ = C_D C_C C_B C_A X + C_D C_C C_B C_A D_A + C_D C_C C_B D_B + C_D C_C D_C + C_D D_D.$$

This process may be repeated to encode any number of sequential sets of symbols in parallel.

Figure 8:
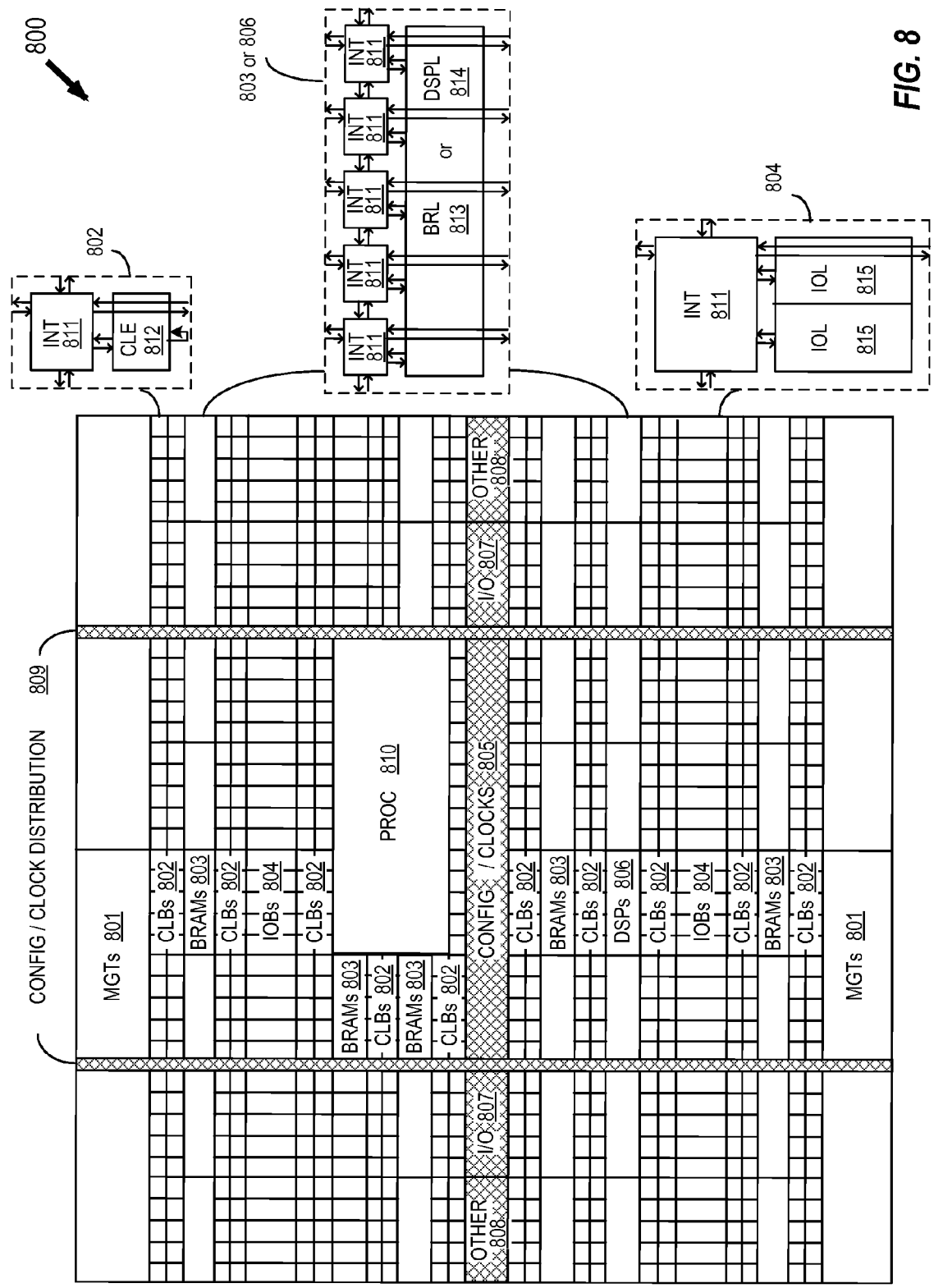
FIG. 8 shows a block diagram of an example programmable integrated circuit that may be used in implementing a Reed-Solomon encoder.

FIG. 8 is a block diagram of an example programmable logic integrated circuit that may be used in implementing a decoder for forward error correction in accordance with one or more embodiments. A decoder for forward error correction, as previously described, may be implemented on the programmable logic and interconnect resources of a programmable integrated circuit.

Programmable ICs can include several different types of programmable logic blocks in the array. For example, FIG. 8 illustrates a type of programmable IC known as a field programmable gate array (FPGA) (800) that includes a large number of different programmable tiles including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), specialized input/output blocks (I/O 807), for example, e.g., clock ports, and other programmable logic 808 such as digital clock managers, analog-to-digital converters, system monitoring logic, and so forth. Some FPGAs also include dedicated processor blocks (PROC 810).

In some FPGAs, each programmable tile includes a programmable interconnect element (INT 811) having standardized connections to and from a corresponding interconnect element in each adjacent tile. Therefore, the programmable interconnect elements taken together implement the programmable interconnect structure for the illustrated FPGA. The programmable interconnect element INT 811 also includes the connections to and from the programmable logic element within the same tile, as shown by the examples included at the top of FIG. 8.

For example, a CLB 802 can include a configurable logic element CLE 812 that can be programmed to implement user logic plus a single programmable interconnect element INT 811. A BRAM 803 can include a BRAM logic element (BRL 813) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 806 can include a DSP logic element (DSPL 814) in addition to an appropriate number of programmable interconnect elements. An IOB 804 can include, for example, two instances of an input/output logic element (IOL 815) in addition to one instance of the programmable interconnect element INT 811. As will be clear to those of skill in the art, the actual I/O pads connected, for example, to the I/O logic element 815 are manufactured using metal layered above the various illustrated logic blocks, and typically are not confined to the area of the input/output logic element 815.

In the pictured embodiment, a columnar area near the center of the die (shown shaded in FIG. 8) is used for configuration, clock, and other control logic. Horizontal areas 809 extending from this column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic.

Figure 9:
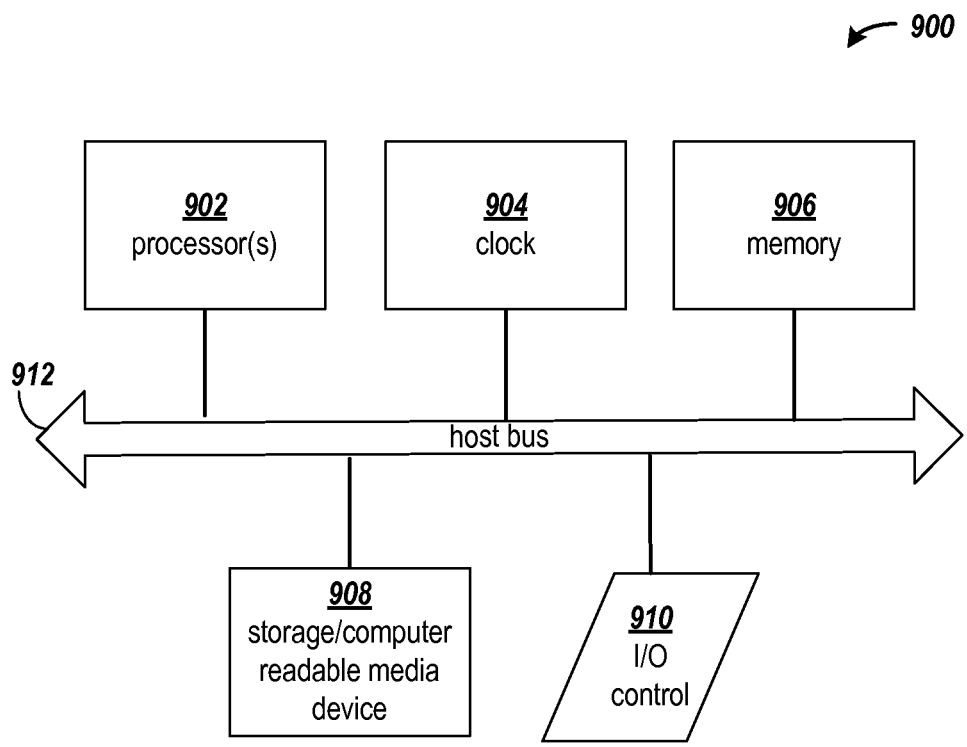
FIG. 9 shows a computing arrangement that may be configured to implement the processes and functions described herein.

FIG. 9 shows a block diagram of an example computing arrangement that may be configured to implement the processes and functions described herein. It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Processor computing arrangement 900 includes one or more processors 902, a clock signal generator 904, a memory unit 906, a storage unit 908, and an input/output control unit 910 coupled to a host bus 912. The arrangement 900 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 902 may be one or more general purpose processors, or a combination of one or more general purpose processors and suitable co-processors, or one or more specialized processors (e.g., RISC, CISC, pipelined, etc.).

The memory arrangement 906 typically includes multiple levels of cache memory, and a main memory. The storage arrangement 908 may include local and/or remote persistent storage such as provided by magnetic disks (not shown), flash, EPROM, or other non-volatile data storage. The storage unit may be read or read/write capable. Further, the memory 906 and storage 908 may be combined in a single arrangement.

The processor arrangement 902 executes the software in storage 908 and/or memory 906 arrangements, reads data from and stores data to the storage 908 and/or memory 906 arrangements, and communicates with external devices through the input/output control arrangement 910. These functions are synchronized by the clock signal generator 904. The resource of the computing arrangement may be managed by either an operating system (not shown), or a hardware control unit (not shown).

The embodiments are thought to be applicable to a variety of systems for forward error correction. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A method for encoding N symbols of a sequence in parallel using an R parity symbol encoding algorithm, comprising operating at least one circuit that performs operations of:
adding a first symbol matrix including symbols 1 through L of the N symbols to a first parity matrix over a finite field to produce a first intermediate matrix, the first parity matrix including parity symbols calculated from a first set of symbols of the sequence that precedes the N symbols in the sequence, wherein N=L+M;
multiplying the first intermediate matrix by at least a first coefficient matrix and a second coefficient matrix over the finite field to produce a second intermediate matrix, the first coefficient matrix including a first respective set of constants for each one of L coefficients of an R-coefficient code generation polynomial, and the second coefficient matrix including a respective set of constants for each one of M coefficients of the R-coefficient code generation polynomial;
multiplying a second symbol matrix by at least the second coefficient matrix to produce a third intermediate matrix, the second symbol matrix including M symbols that immediately follow the L symbols in the sequence;
adding at least the second and third intermediate matrices to produce a second parity matrix; and
outputting a codeword, including the N symbols of the sequence and the second parity matrix, for forward error correction, wherein N≥4.

2. The method of claim 1, further comprising:
encoding a second set of symbols that follow the N symbols in the sequence by repeating the addition and multiplication operations using:
L first symbols of the second set of symbols as the first symbol matrix;
M symbols following the L first symbols of the second set of symbols as the second symbol matrix; and
the second parity matrix as the first parity matrix.

3. The method of claim 1, wherein the first parity matrix includes parity symbols calculated from symbols of the sequence that precede the N symbols.

4. The method of claim 1, wherein the second coefficient matrix is an R×R matrix formed by a combination of an M×M matrix, including the respective set of constants for each one of the M coefficients, and an identity matrix.

5. The method of claim 1, wherein the adding and multiplying to produce the first intermediate matrix is performed concurrently with the multiplying to produce the third intermediate matrix.

6. The method of claim 5, wherein $M \leq R$, $L \leq R$, and $P \leq R$.

7. The method of claim 1, wherein $M \leq R$ and $L \leq R$.

8. The method of claim 1, wherein $N > R$.

9. The method of claim 1, the operations further including:
multiplying a third symbol matrix by at least a third coefficient matrix to produce a fourth intermediate matrix, the second symbol matrix including P symbols that immediately follow the M symbols in the sequence; and
wherein:
the second intermediate matrix is a product of the first intermediate matrix, the first and second coefficient matrices, and a third coefficient matrix;
the third intermediate matrix is a product of the second symbol matrix and the second and third coefficient matrices; and
the second parity matrix is a sum of the second, third, and fourth intermediate matrices.

10. A system for encoding N symbols of a sequence in parallel using an R parity symbol encoding algorithm, wherein $N \geq 4$, comprising:
a first circuit configured to multiply a first parity matrix by at least a first coefficient matrix and a second coefficient matrix over a finite field to produce a first intermediate matrix, the first parity matrix including parity symbols calculated from a set of symbols of the sequence that precede the N symbols in the sequence, the first coefficient matrix including a first respective set of constants for each one of L coefficients of an R-coefficient code generation polynomial, and the second coefficient matrix including a respective set of constants for each one of M coefficients of the R-coefficient code generation polynomial;
a second circuit configured to multiply a first symbol matrix by at least the first and second coefficient matrices over the finite field to produce a second intermediate matrix, the first symbol matrix including symbols 1 through L of the N symbols;
a third circuit configured to multiply a second symbol matrix by at least the second coefficient matrix over the finite field to produce a third intermediate matrix, the second symbol matrix including M symbols that immediately follow the L symbols in the sequence; and
a fourth circuit, configured to add at least the first, second, and third intermediate matrices over the finite field to produce a second parity matrix.

11. The system of claim 10, wherein the first circuit is configured to operate in parallel with each of the second and third circuits.

12. The system of claim 10, wherein $M+L=N$.

13. The system of claim 10, further comprising:
a fifth circuit configured to multiply a third symbol matrix by at least a third coefficient matrix over the finite field to produce a fourth intermediate matrix, the third symbol matrix including P symbols that immediately follow the M symbols in the sequence; and
wherein:
the first circuit is configured to multiply the first parity matrix by at least the first and second coefficient matrices and a third coefficient matrix over the finite field to produce the first intermediate matrix;
the second circuit is configured to multiply the first symbol matrix by at least the first, second, and third coefficient matrices over the finite field to produce the second intermediate matrix, the first symbol matrix including symbols 1 through L of the N symbols;
the third circuit is configured to multiply the second symbol matrix by at least the second and third coefficient matrices over the finite field to produce the third intermediate matrix, the second symbol matrix including M symbols that immediately follow the L symbols in the sequence; and
a fourth circuit is configured to add at least the first, second, third, and fourth intermediate matrices over the finite field to produce the second parity matrix.

14. The system of claim 13, wherein $M \leq R$, $L \leq R$, and $P \leq R$.

15. The system of claim 13, wherein $M+L+P=N$.

16. The system of claim 13, wherein $N > R$.

17. A method for encoding N symbols of a sequence in parallel using an R parity symbol encoding algorithm, wherein $N \geq 4$, comprising:
using a first pipeline stage, multiplying a first symbol matrix by a first coefficient matrix over a finite field to produce a first intermediate matrix, the first symbol matrix including symbols 1 through L of the N symbols, and the first coefficient matrix including a first respective set of constants for each one of L coefficients of an R-coefficient code generation polynomial;
using a second pipeline stage, multiplying a sum of the first intermediate matrix and a second symbol matrix by a second coefficient matrix over the finite field to produce a second intermediate matrix;
adding the second intermediate matrix to a first parity matrix over the finite field to produce a third intermediate matrix, the first parity matrix including parity symbols calculated from a set of symbols of the sequence that precede the N symbols in the sequence, wherein $N=L+M$; and
multiplying the third intermediate matrix by at least the first and second coefficient matrices over the finite field to produce a second parity matrix; and
outputting an codeword, including the N symbols of the sequence and the second parity matrix, for forward error correction.

18. The method of claim 17, wherein $M \leq R$ and $L \leq R$.

19. The method of claim 17, wherein $N > R$.

20. The method of claim 17, wherein:
$M < R$; and
the second coefficient matrix is an $R \times R$ matrix formed by a combination of an $M \times M$ matrix, including the respective set of constants for each one of the M coefficients, and an identity matrix.

* * * * *